(12) United States Patent
Fan et al.

(10) Patent No.: US 10,685,876 B2
(45) Date of Patent: Jun. 16, 2020

(54) LINER AND CAP STRUCTURES FOR REDUCING LOCAL INTERCONNECT VERTICAL RESISTANCE WITHOUT COMPROMISING RELIABILITY

(71) Applicant: International Business Machines Corporation, Armonk, NY (US)

(72) Inventors: Su Chen Fan, Cohoes, NY (US); Hemanth Jagannathan, Niskayuna, NY (US); Raghuveer R. Patlolla, Guilderland, NY (US); Cornelius Brown Peethala, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/133,785

(22) Filed: Sep. 18, 2018

(65) Prior Publication Data
US 2020/0090989 A1    Mar. 19, 2020

(51) Int. Cl.
*H01L 21/768* (2006.01)
*H01L 23/532* (2006.01)
*H01L 23/522* (2006.01)

(52) U.S. Cl.
CPC .. *H01L 21/76849* (2013.01); *H01L 21/76871* (2013.01); *H01L 23/5226* (2013.01); *H01L 23/53238* (2013.01); *H01L 23/53295* (2013.01)

(58) Field of Classification Search
CPC .......... H01L 23/53295; H01L 23/5226; H01L 23/53238; H01L 21/76849; H01L 21/76871
See application file for complete search history.

(56) References Cited

U.S. PATENT DOCUMENTS

| 9,634,113 B2 | 4/2017 | Rubin et al. |
| 9,741,609 B1 | 8/2017 | Cheng et al. |
| (Continued) | | |

OTHER PUBLICATIONS

Fan et al., "Middle of Line RC Performance Study at the 7 nm Node," 2017 IEEE International Interconnect Technology Conference (IITC), IEEE, 2017, 3 pages.

(Continued)

*Primary Examiner* — William F Kraig
*Assistant Examiner* — Khatib A Rahman
(74) *Attorney, Agent, or Firm* — Cantor Colburn LLP; Vazken Alexanian

(57) ABSTRACT

Embodiments of the invention are directed to an interconnect stack including a first dielectric layer, a first trench formed in the first dielectric layer, and a first liner deposited in the first trench, wherein the first liner defines a second trench. A first conductive material is in the second trench and deposited over the first dielectric layer and the first conductive material. A third trench extends through the second dielectric layer and is over the first conductive material. A bottom surface of the third trench includes at least a portion of the top surface of the first conductive material. A second liner is in the third trench, on sidewalls of the third trench, and also on the portion of the top surface of the first conductive material. The second liner functions as a cap region configured to counter electro-migration or surface migration of the first conductive material.

17 Claims, 6 Drawing Sheets

(56) References Cited

U.S. PATENT DOCUMENTS

| | | |
|---|---|---|
| 9,859,157 B1 | 1/2018 | Murray et al. |
| 2005/0098896 A1* | 5/2005 | Huang .............. H01L 23/53295 257/760 |
| 2015/0014778 A1* | 1/2015 | Cheng ................. H01L 21/8258 257/369 |
| 2017/0117246 A1* | 4/2017 | Paknejad ................. H01L 24/83 |
| 2017/0271512 A1 | 9/2017 | Adusumilli et al. |
| 2017/0278747 A1 | 9/2017 | Adusumilli et al. |
| 2017/0278800 A1 | 9/2017 | Adusumilli et al. |
| 2018/0061956 A1 | 3/2018 | Adusumilli et al. |
| 2018/0076086 A1 | 3/2018 | Clevenger et al. |

OTHER PUBLICATIONS

Wu et al., "Cobalt CMP Development for 7nm Logic Device," ECS Meeting Abstracts, Abstract MA2017-01 1258, Contact and MOL Technology, May 2017, 2 pages.

Fan et al., "Liner and Cap Structures for Reducing Local Interconnect Vertical Resistance Without Compromising Reliability," U.S. Appl. No. 16/685,142, filed Nov. 15, 2019.

List of IBM Patents or Patent Applications Treated As Related; Date Filed: Nov. 15, 2019, 2 pages.

\* cited by examiner

CA IS MISALIGNED

LINER AND CAP STRUCTURES FOR REDUCING LOCAL INTERCONNECT VERTICAL RESISTANCE WITHOUT COMPROMISING RELIABILITY

BACKGROUND

The present invention relates in general to fabrication methodologies and resulting structures for semiconductor devices. More specifically, the present invention related to liner and cap structures configured to reduce the vertical resistance in local interconnect structures without compromising reliability, and more specifically, without compromising the electro-migration and/or surface migration performance of the interconnect structure.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections are formed above these logical and functional layers during the BEOL stage to complete the IC.

SUMMARY

Embodiments of the invention are directed to a method of forming an interconnect stack. The method includes forming a first dielectric layer, forming a first trench in the first dielectric wafer, and depositing a first liner in the first trench, wherein the first liner defines a second trench. A first conductive material is deposited in the second trench, a second dielectric layer is deposited over the first dielectric layer and the first conductive material. A third trench extends through the second dielectric layer and over the first conductive material. At least a portion of a top surface of the first conductive material is exposed, wherein a bottom surface of the third trench includes the exposed portion of the top surface of the first conductive material. A second liner is deposited in the third trench, wherein the second liner is on sidewalls of the third trench. The second liner is also on the exposed portion of the top surface of the first conductive material, wherein the second liner that is on the exposed portion of the top surface of the first conductive material functions as a cap region configured to counter electro-migration or surface migration at the top surface of the first conductive material.

Embodiments of the invention are directed to a method of forming an interconnect stack, wherein the method includes forming a first dielectric layer, forming a first trench in the first dielectric wafer, and depositing a first liner in the first trench, wherein the first liner defines a second trench. A first conductive material is deposited in the second trench. A second dielectric layer is deposited over the first dielectric layer and the first conductive material, wherein the second dielectric layer includes a first region and a second region. A third trench is formed extending through the first and second regions of the second dielectric layer and over the first conductive material. A first region of the third trench is within the first region of the second dielectric layer. A second region of the third trench is within the second region of the second dielectric layer. A volume of the first region of the third trench is different than a volume of the second region of the third trench. At least a portion of the top surface of the first conductive material is exposed, wherein a bottom surface of the third trench includes the exposed portion of the top surface of the first conductive material. A second liner is deposited in the third trench. The second liner is on sidewalls of the first portion of the third trench. The second liner is also on sidewalls of the second portion of the third trench. The second liner is also on the exposed portion of the top surface of the first conductive material. The second liner that is on the exposed portion of the top surface of the first conductive material functions as a cap region configured to counter electro-migration or surface migration at the top surface of the first conductive material.

Embodiments of the invention are directed to an interconnect stack including a first dielectric layer, a first trench formed in the first dielectric layer, and a first liner deposited in the first trench, wherein the first liner defines a second trench. A first conductive material is in the second trench. A second dielectric layer is deposited over the first dielectric layer and the first conductive material. A third trench extends through the second dielectric layer and is over the first conductive material. A bottom surface of the third trench includes at least a portion of the top surface of the first conductive material. A second liner is in the third trench, wherein the second liner is on sidewalls of the third trench. The second liner is also on the portion of the top surface of the first conductive material. The second liner that is on the portion of the top surface of the first conductive material functions as a cap region configured to counter electro-migration or surface migration at the top surface of the first conductive material.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 6-11 depicts cross-sectional views of a semiconductor wafer after fabrication operations for forming the interconnect structure stack shown in FIG. 1 according to embodiments of the invention, in which:

FIG. 6 depicts a cross-sectional view of the semiconductor wafer shown in FIG. 1, taken along lines x-x' and y-y' of FIG. 1, after initial interconnect stack fabrication operations according to embodiments of the invention;

FIG. 7 depicts a cross-sectional view of the semiconductor wafer shown in FIG. 1, taken along lines x-x' and y-y' of FIG. 1, after interconnect stack fabrication operations according to embodiments of the invention;

FIG. 8 depicts a cross-sectional view of the semiconductor wafer shown in FIG. 1, taken along lines x-x' and y-y' of FIG. 1, after interconnect stack fabrication operations according to embodiments of the invention;

FIG. 9 depicts a cross-sectional view of the semiconductor wafer shown in FIG. 1, taken along lines x-x' and y-y' of FIG. 1, after interconnect stack fabrication operations according to embodiments of the invention;

FIG. 10 depicts a cross-sectional view of the semiconductor wafer shown in FIG. 1, taken along lines x-x' and y-y' of FIG. 1, after interconnect stack fabrication operations according to embodiments of the invention; and FIG. 11 depicts a cross-sectional view of the semiconductor wafer shown in FIG. 1, taken along lines x-x' and y-y' of FIG. 1, after interconnect stack fabrication operations according to embodiments of the invention.

Figure 1:
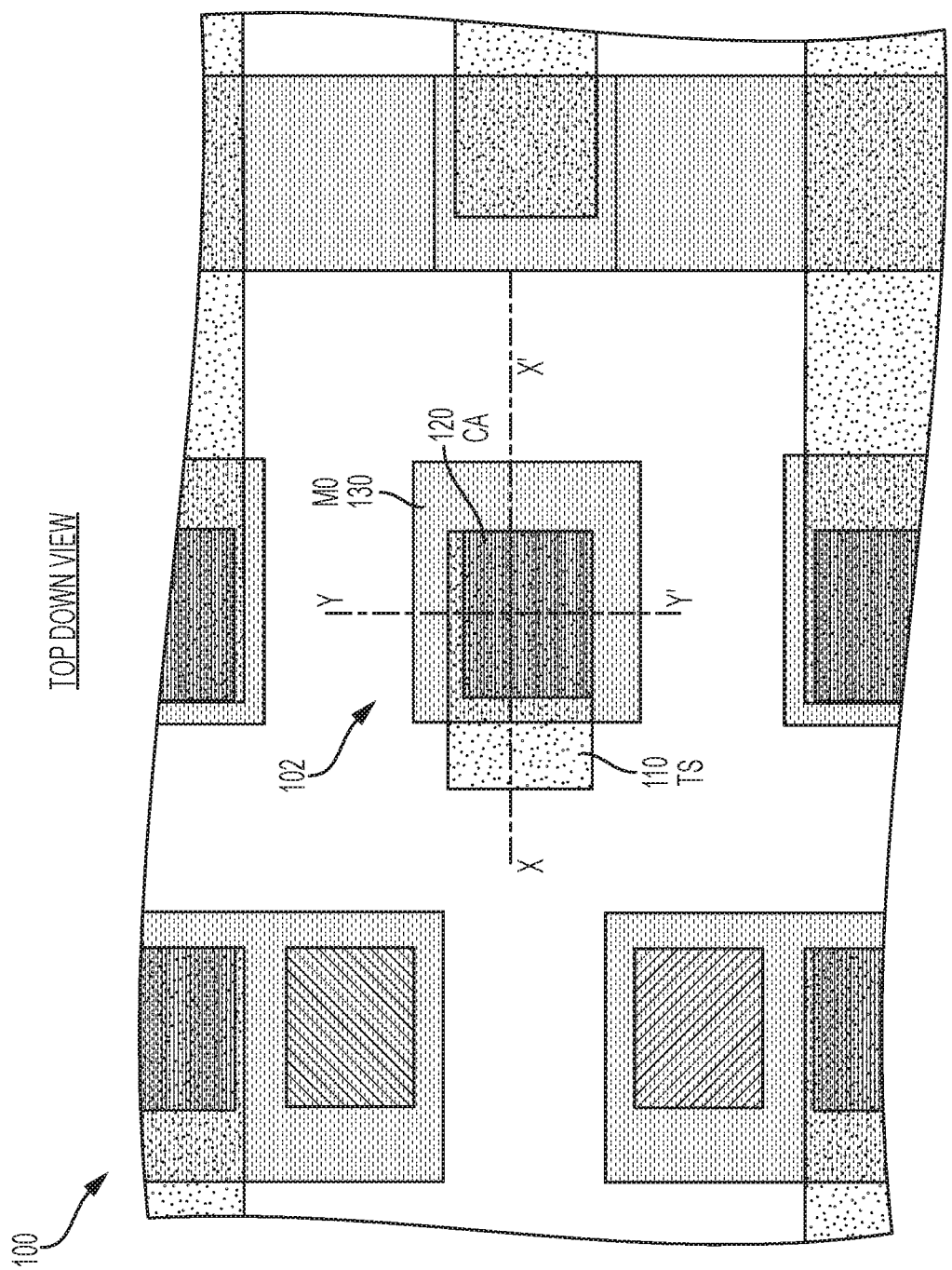
FIG. 1 depicts a top down view of a portion of a semiconductor wafer having an interconnect stack capable of being implemented in accordance with embodiments of the invention.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of interconnect stack, implementation of the teachings recited herein are not limited to a particular type of interconnect stack or IC architecture. Rather, embodiments of the present invention are capable of being implemented in conjunction with any other type of interconnect stack or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, semiconductor devices are used in a variety of electronic and electro-optical applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and conductive interconnect layers are fabricated. More specifically, during the first portion of chip-making (i.e., the FEOL stage), the individual components (transistors, capacitors, etc.) are fabricated on the wafer. In the BEOL stage, these components are connected to each other to distribute signals, as well as power and ground. The conductive interconnect layers serve as a network of pathways that transport signals throughout an IC, thereby connecting circuit components of the IC into a functioning whole and to the outside world. Because there typically isn't enough room on the chip surface to create all of the necessary connections in a single layer, chip manufacturers build vertical levels of interconnects. While simpler ICs can have just a few metal layers, complex ICs can have ten or more layers of wiring.

Interconnects close to the transistors need to be small because they attach/join to the components that are themselves very small and often closely packed together. These lower-level lines, which can be referred to as local interconnects, are usually thin and short in length. Global interconnects are higher up in the structure and travel between different blocks of the circuit. Thus, global interconnects are typically thick, long, and widely separated. Connections between interconnect levels, called vias, allow signals and power to be transmitted from one layer to the next. For example, a through-silicon via (TSV) is a conductive contact that passes completely through a given semiconductor wafer or die. In multilevel IC configurations, for example, a TSV can be used to form vertical interconnections between a semiconductor device located on one level of the IC and an interconnect layer located on another level of the IC. These vertical interconnect structures include an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. In some applications, the second end of the contact structure can be connected to a contact region of a further semiconductor-based circuit element, in which case the interconnect structure in the contact level is also referred to as a local interconnect. The contact structure can include contact elements or contact plugs having a generally square-like or round shape that are formed in an interlayer dielectric (ILD) material, which in turn encloses and passivates the circuit elements.

As the critical dimensions of the circuit elements in the device level have been decreased, the dimensions of the various interconnect structures (e.g., metal lines/wires, vias, contact elements, and the like) have also reduced. In some cases, the increased packing density mandates the use of sophisticated metal-containing materials in order to improve reliability and provide a sufficiently high conductivity of the individual metal lines and vias. For example, to achieve a desired level of reliability in complex metallization systems, interconnect structures can be formed from copper in combination with a liner/barrier layer(s) and cap layers in order to achieve the required electrical performance and to minimize electro-migration and/or surface migration failure mechanisms. Copper is a highly conductive material so forming lines, contacts and/or vias from high conductivity copper improve overall IC performance. In addition, copper can be fabricated into smaller structures than other conductive materials such as aluminum, which allows interconnect structures to keep pace with transistor size scaling. Copper is also more durable and reliable. The liner and cap layers surround the particular interconnect structure (e.g., line, contact, and/or via) and serves multiple functions. For example, the liner/cap can function as a barrier to prevent metals in the interconnect structure from migrating into the surrounding ILD in which the interconnect structures are formed. Additionally, the liner/cap can provide adhesion between the metal interconnect structure and the surrounding ILD. Additionally, the liner/cap can improve reliability by stabilizing the interconnect structure to reduce the likelihood of electro-migration and/or surface migration failure mechanisms in the interconnect structure.

Interconnect structures are often formed in a stack. For example, a transistor can have a gate contact (also referred to as a CB contact) and source/drain contacts (also referred to as CA contacts). The gate contact can extend vertically through the ILD material of the IC from a metal wire or via in the first BEOL to an initial metal level (referred to as the M0 level) to the gate of the transistor. The source/drain contacts can extend vertically through the ILD material from metal wires or vias in the BEOL metal level to metal plugs (also referred to as trench silicide (TS) contacts), which are on the source/drain regions of the transistor. A conventional copper interconnect stack fabrication process starts with the deposition of an ILD insulating material (e.g., $SiO_2$) over the transistor followed by the creation of trenches in the ILD insulating material. The trenches are positioned over the portion of the transistor (source, gate, drain) to which electrical coupling will be made. The liner/barrier material is deposited within the trench, and the remaining trench volume is filled with copper using, for example, a chemical/electroplating process, to thereby form the relevant portion of the interconnect structure stack (e.g., a line, a via, a contact, etc.). The excess copper is removed to form a flat surface for subsequent processing. A cap layer is deposited over the exposed top surface of the relevant portion of the interconnect stack. This process is repeated until all portions of the interconnect structure stack have been formed.

With continued reductions in device dimensions, a limiting factor for the operating speed of the final IC product is no longer the individual transistor element but the electrical performance of the complex interconnect/wiring system that is formed above the device level of the IC. More specifically, as IC feature sizes continue to decrease, the aspect ratio, (i.e., the ratio of height/depth to width) of features such as interconnect structures generally increases. In general, interconnect structures provide current paths that move horizontally in all directions along a major surface of a given level of the IC, as well as current paths that move current vertically from one level of the IC to another. Although the resistivity of interconnect structures in the horizontal and vertical directions must be kept sufficiently low, with narrower, taller (i.e., higher-aspect-ratio) interconnect structures, managing vertical resistivity is a challenge. For example, the liner/barrier and cap materials that are most effective in providing barrier, adhesion and reliability functions are also relatively high resistivity materials that slow down current flow through the interconnect structure stack in the vertical direction. As the aspect ratio of interconnect structure stacks continues to increase, the negative impact of the high resistivity liner/barrier and cap layers of each interconnect element (e.g., line, via, contact, etc.) in the stack on current flowing through the interconnect stack in the vertical direction also increases.

Accordingly, it is a challenge to provide interconnect scaling without allowing the various interconnect structures to become a bottleneck that reduces IC performance by increasing vertical resistivity and slowing the flow of electrons between IC levels in the vertical direction.

Turning now to an overview of aspects of the invention, embodiments of the invention provide liner and cap structures configured to reduce the vertical resistance in local interconnect structures without compromising reliability, and more specifically, without compromising the electro-migration and/or surface migration performance of the interconnect structure. In embodiment of the invention, vertical resistance is reduced by providing dual-role cap/liner segments between the elements (e.g., trench silicide regions, S/D contacts, and M0 lines) that form an interconnect stack. The dual-role cap/liner segments function as a cap for the interconnect element below the dual-role cap/liner, and functions as a liner for the interconnect element above the dual-role cap/liner. In some embodiments of the invention, a dual-role cap/liner segment is provided between a bottom interconnect element (e.g., a silicide region) and a central interconnect element (e.g., a CA), and no cap/liner is provided between the central interconnect element and a top interconnect element (e.g., M0). The need for a cap/liner between the central interconnect element and the top interconnect element can be avoided by forming the central interconnect element and the top interconnect element an integral element, and by having the central interconnect element and the top interconnect element share the same liner. Accordingly, aspects of the invention allow interconnect scaling without allowing the various interconnect structures to become a bottleneck that reduces IC performance by increasing vertical resistivity and slowing the flow of electrons between IC levels in the vertical direction.

Turning now to a more detailed description of aspects of the present invention, FIG. 1 depicts a top-down view of a portion of a semiconductor wafer 100 on which an interconnect stack 102 is formed in accordance with aspects of the invention. The interconnect stack 102 includes (moving from bottom to top) a TS contact 110, a CA contact 120, and an M0 line/wire 130, configured and arranged as shown. The TS contact 110 is positioned over and communicatively coupled to a source or drain (S/D) region 104 (shown in FIGS. 2-5) of a transistor.

Figure 2:
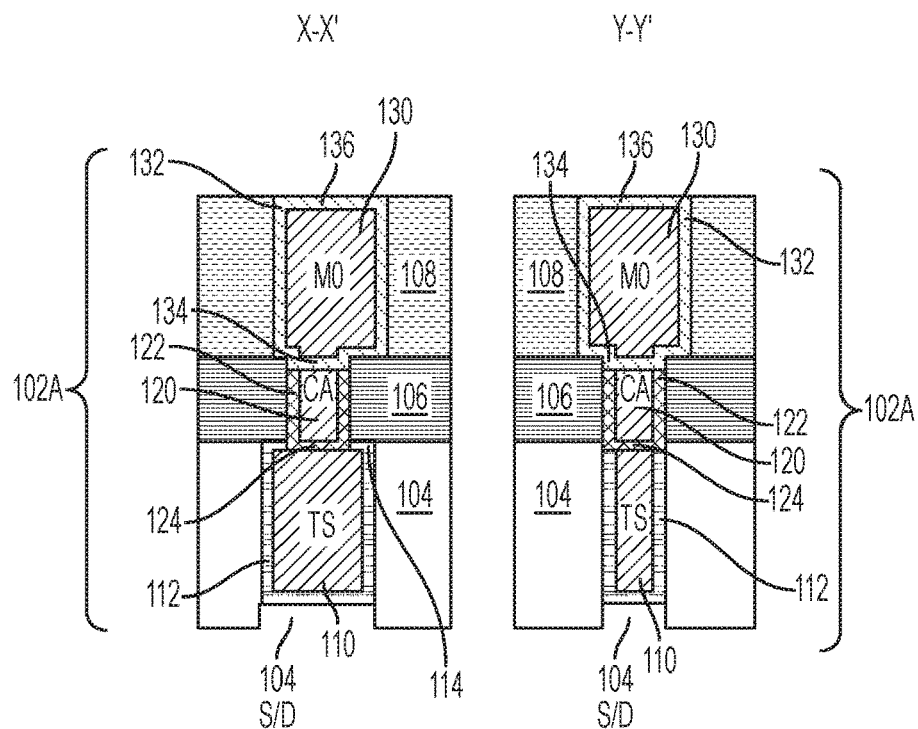
FIG. 2 depicts cross-sectional views of an example of the interconnect stack shown in FIG. 1, taken along lines x-x' and y-y'.

FIG. 2 depicts cross-sectional views of an interconnect stack 102A, which is an example of the interconnect stack 102 shown in FIG. 1. The cross-sectional views of the interconnect stack 102A are taken along lines x-x' and y-y' of FIG. 1. The interconnect stack 102A includes a TS contact 110, a CA contact 120, and an M0 line 130, configured and arranged as shown. The TS contact 110 is formed in a first dielectric region/layer 104, and a liner 112 is on sidewalls and a bottom surface of the TS contact 110. A cap layer 114A (best shown in the x-x' view) is on part of a top surface of the TS contact 110. The TS contact 110 is communicatively coupled through the liner 112 to a S/D region 109 of a transistor. The CA contact 120 is formed in a second dielectric region/layer 106 that has been formed over the first dielectric layer 104. A liner/barrier 122 is on sidewalls of the CA contact 120, and a dual-role liner/barrier 124 is on a bottom surface of the CA contact 120 and on a portion of the top surface of the TS contact 110. In accordance with aspects of the invention, the dual-role liner 124 functions as a liner for the bottom surface of the CA contact 120 and functions as a cap layer for a portion of the top surface of the TS contact 110. Thus, the cap of the TS contact 110 is formed by a combination of the cap 114A and the dual-role liner 124. The cap 114A and the dual-role liner 124 is in contrast to known interconnect stack architectures in which a TS cap would be provided for TS contact 110, and the CA liner would be separate and distinct from the TS cap, and would be positioned on top of the TS cap.

The liner 112, cap 114A, dual-role liner 124, and liner 122 serve multiple functions. More specifically, the liner 112 functions as a barrier to prevent metals in the TS contact 110 from migrating into the first dielectric region 104, the second dielectric region 106, and the S/D region 109. Additionally, the liner 112 can provide adhesion between the TS contact 110 and the first and second dielectric regions 104, 106. Additionally, the liner 112, the cap 114A, and the dual-role liner 124 improve reliability by stabilizing the TS contact 110 to reduce the likelihood of electro-migration and/or surface migration failure mechanisms at the surfaces of the TS contact 110. Additionally, the liner 122 and dual-role liner 124 function as a barrier to prevent metals in the CA contact 120 from migrating into the second dielectric region 104 and the TS contact 110. Additionally, the liner 122 can provide adhesion between the CA contact 120 and the second dielectric region 106. Additionally, the liner 122 and the dual-role liner 124 improve reliability by stabilizing the CA contact 120 to reduce the likelihood of electro-migration and/or surface migration failure mechanisms at the surfaces of the CA contact 120. The materials that are most effective in providing the above-described barrier, adhesion and reliability functions are also relatively high resistivity materials that can slow down current flow through the interconnect structure stack 102A in the vertical direction. In accordance with aspects of the invention, current flowing in the vertical direction from the TS contact 110 to the CA contact 120 only needs to pass through the dual-role liner 124, which reduces the vertical current resistance for the interconnect stack 102A in comparison to known interconnect stack architectures which would require current flowing from the TS contact 110 to the CA contact 120 to flow through a TS cap and a separate CA liner.

Continuing with FIG. 2, the M0 line 130 is formed in a third dielectric region/layer 108 that has been formed over the second dielectric layer 106. A liner/barrier 132 is on sidewalls of the M0 line 130, a cap 136 is on a top surface of the M0 line 130, and a dual-role liner/barrier 134 is on a bottom surface of the M0 line 130 and on the top surface of the CA contact 120. In accordance with aspects of the invention, the dual-role liner 134 functions as a liner for the bottom surface of the M0 line 130 and functions as a cap layer for the top surface of the CA contact 120. Thus, the cap of the CA contact 120 is formed by the dual-role liner 134.

Similar to the liner 112, cap 114A, dual-role liner 124, and liner 122, the liner 132, the cap 136, and the dual-role liner 134 serve multiple functions. More specifically, the liner 132 functions as a barrier to prevent metals in the M0 line 130 from migrating into the third dielectric region 108 and the second dielectric region 106. Additionally, the liner 132 can provide adhesion between the M0 line 130 and the second and third dielectric regions 106, 108. Additionally, the liner 132, the cap 136, and the dual-role liner 134 improve reliability by stabilizing the M0 line 130 to reduce the likelihood of electro-migration and/or surface migration failure mechanisms at the surfaces of the M0 line 130. Additionally, the liner 132 and dual-role liner 134 function as a barrier to prevent metals in the M0 line 130 from migrating into the third dielectric region 108, the second dielectric region 106 and the CA contact 120. Additionally, the dual-role liner 134 improves reliability by stabilizing the CA contact 120 to reduce the likelihood of electro-migration and/or surface migration failure mechanisms at the surfaces of the CA contact 120. The materials that are most effective in providing the above-described barrier, adhesion and reliability functions are also relatively high resistivity materials that can slow down current flow through the interconnect structure stack 102A in the vertical direction. In accordance with aspects of the invention, current flowing in the vertical direction from the CA contact 120 to the M0 line 130 only needs to pass through the dual-role liner 134, which reduces the vertical current resistance for the interconnect stack 102A in comparison to known interconnect stack architectures which would require current flowing from the CA contact 120 to the M0 line 130 to flow through a CA cap and a separate M0 liner.

In embodiments of the invention, the first, second, and third dielectric regions 104, 106, 108 can be the same or different material. In some embodiments of the invention, the first dielectric region 104 can be formed from a variety of dielectric materials, including, but not limited to, $SiO_2$. In some embodiments of the invention, the second dielectric region 106 can be formed from a variety of dielectric materials, including, but not limited to, SiN, SiOCN, and SiBCN. In some embodiments of the invention, the third dielectric region 108 can be formed from a variety of dielectric materials, including, but not limited to, an ultra-low-k (ULK) dielectric material such as SiCOH. In general, a dielectric is considered ULK when its dielectric constant is less than about 2.5. The liners 112, 122, 132, the cap layers 114A, 136, and the dual-role liners 124, 134 can be the same or different material. In some embodiments of the invention, the liner 112 can be formed from a variety of high resistivity materials, including, but not limited to, TiN. In some embodiments of the invention, the liner 122 can be formed from a variety of high resistivity materials, including, but not limited to, TiN. In some embodiments of the invention, the liner 132 can be formed from a variety of high resistivity materials, including, but not limited to, TiN, Co, Ru, and TaN. In some embodiments of the invention, the cap layer 114A can be formed from a variety of high resistivity materials, including, but not limited to, TiN. In some embodiments of the invention, the cap layer 136 can be formed from a variety of high resistivity materials, including, but not limited to, TiN, Co, Ru, and TaN. In some embodiments of the invention, the dual-role liner 124 can be formed from a variety of high resistivity materials, including, but not limited to, TiN. In some embodiments of the invention, the dual-role liner 134 can be formed from a variety of high resistivity materials, including, but not limited to, TiN, Co, Ru, and TaN. In embodiments of the invention, the TS contact 110, the CA contact 120, and the M0 line can be the same or different material. In some embodiments of the invention, the TS contact 110 can be formed from a variety of low resistivity silicide materials, including, but not limited to, tungsten (W). In some embodiments of the invention, the CA contact 120 can be formed from a variety of low resistivity materials, including, but not limited to Cu. In some embodiments of the invention, the M0 line 130 can be formed from a variety of low resistivity materials, including, but not limited to Cu.

In embodiments of the invention, the resistivity values ("ρ") for the low resistivity metals used to form the TS contact 110, the CA contact 120, and the M0 line 130 can be between about $1 \times 10^{-8}$ ohm meters and about $3 \times 10^{-6}$ ohm meters. A material can generally be considered to have low resistivity if its resistivity is below about $1 \times 10^6$ ohm meters. In embodiments of the invention, the resistivity values for the high resistivity materials used to form the liners 112, 122, 132, the cap layers 114A, 136, and the dual-role liners 124, 134 can be between about $1 \sim 8 \times 10^{-8}$ ohm meters and about $1 \sim 8 \times 10^{-8}$ ohm meters. A material can generally be considered to have high resistivity if its resistivity is above about $20 \times 10^{-8}$ ohm meters. The electrical resistivity of a particular conductor material is a measure of how strongly the material opposes the flow of electric current through it. This resistivity factor, sometimes called its "specific electrical resistance," enables the resistance of different types of conductors to be compared to one another at a specified temperature according to their physical properties without regards to their lengths or cross-sectional areas. Thus, the higher the resistivity value of p the more resistance and vice versa. For example, the resistivity of a good conductor such as copper is on the order of $1.72 \times 10^{-8}$ ohm meters, whereas the resistivity of a poor conductor (insulator) such as air can be well over $1.5 \times 10^{14}$ ohm meters. Materials such as Cu and Al are known for their low levels of resistivity thus allowing electrical current to easily flow through them making these materials.

Figure 3:
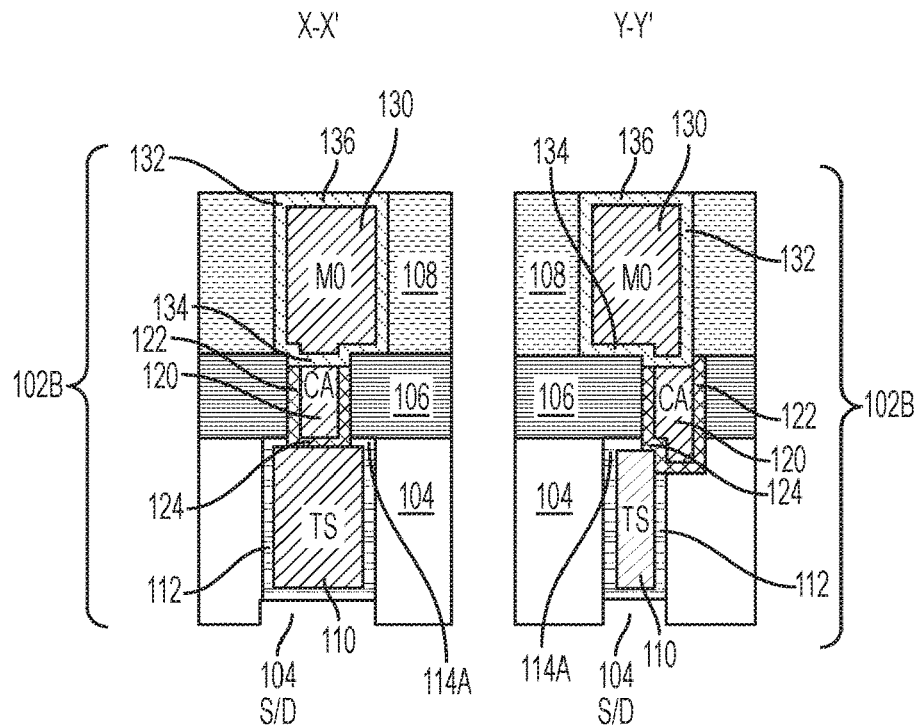
FIG. 3 depicts cross-sectional views of an example of the interconnect stack shown in FIG. 1, taken along lines x-x' and y-y', wherein a portion of the interconnect structure is misaligned.

FIG. 3 depicts cross-sectional views of an interconnect stack 102B in accordance with aspects of the invention. The interconnect stack 102B is identical to the interconnect stack 102A shown in FIG. 2 except the CA contact 120 in the interconnect stack 102B was misaligned during fabrication. CA contact misalignment is a known problem semiconductor wafer fabrication. As best shown in the y-y' view of FIG. 3, as a result of a CA contact misalignment, the region of overlap between the CA contact 120 and the TS contact 110, as well as the region of overlap between the CA contact 120 and the M0 line 130, has been reduced in comparison to the non-misaligned interconnect stack 102A. A technical benefit and effect of aspects of the invention is that the reduced vertical resistance that results from the dual-role liners 124 and 134 at least mitigates, and in some instances offsets, the impact of the misalignment shown in FIG. 3.

Figure 4:
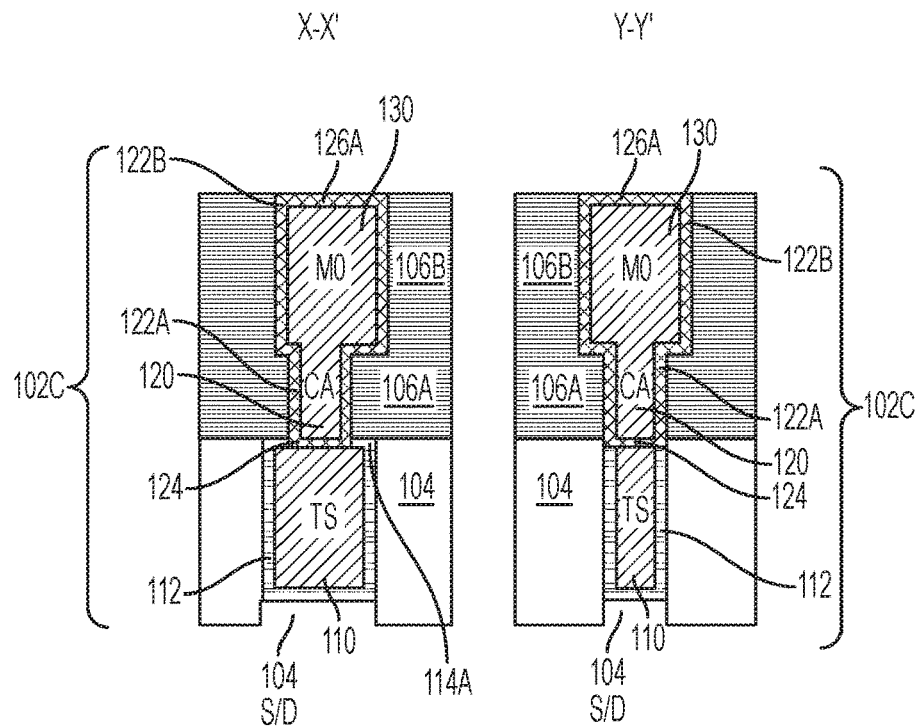
FIG. 4 depicts cross-sectional views an of example of the interconnect stack shown in FIG. 1, taken along lines x-x' and y-y'.

FIG. 4 depicts cross-sectional views of an interconnect stack 102C, which is another example of the interconnect stack 102 shown in FIG. 1. The cross-sectional views of the interconnect stack 102C are taken along lines x-x' and y-y' of FIG. 1. The interconnect stack 102C includes a TS contact 110, a CA contact 120, and an M0 line 130, configured and arranged as shown. The TS contact 110 is formed in a first dielectric region/layer 104, and a liner 112 is on sidewalls and a bottom surface of the TS contact 110. A cap layer 114A (best shown in the x-x' view) is on part of a top surface of the TS contact 110. The TS contact 110 is communicatively coupled through the liner 112 to a S/D region 109 of a transistor. The CA contact 120 is formed in a first region 106A of a second dielectric region/layer that has been formed over the first dielectric layer 104. A first region 122A of a liner/barrier is on sidewalls of the CA contact 120, and a dual-role liner/barrier 124 is on a bottom surface of the CA contact 120 and on a portion of the top surface of the TS contact 110. In accordance with aspects of the invention, the dual-role liner 124 functions as a liner for the bottom surface of the CA contact 120 and functions as a cap layer for a portion of the top surface of the TS contact 110. Thus, the cap of the TS contact 110 is formed by a combination of the cap 114A and the dual-role liner 124. The cap 114A and the dual-role liner 124 is in contrast to known interconnect stack architectures in which a TS cap would be provided for TS contact 110, and the CA liner would be separate and distinct from the TS cap, and would be positioned on top of the TS cap.

The liner 112, cap 114A, dual-role liner 124, and first liner region 122A of the liner formed by 122A, 122B, and 124 serve multiple functions. More specifically, the liner 112 functions as a barrier to prevent metals in the TS contact 110 from migrating into the first dielectric region 104, the second dielectric region 106, and the S/D region 109. Additionally, the liner 112 can provide adhesion between the TS contact 110 and the first and second dielectric regions 104, 106. Additionally, the liner 112, the cap 114A, and the dual-role liner 124 improve reliability by stabilizing the TS contact 110 to reduce the likelihood of electro-migration and/or surface migration failure mechanisms at the surfaces of the TS contact 110. Additionally, the first liner region 122A and the dual-role liner 124 function as a barrier to prevent metals in the CA contact 120 from migrating into the second dielectric region 104 and the TS contact 110. Additionally, the first liner region 122A can provide adhesion between the CA contact 120 and the second dielectric region 106. Additionally, the first liner region 122A and the dual-role liner 124 improve reliability by stabilizing the CA contact 120 to reduce the likelihood of electro-migration and/or surface migration failure mechanisms at the surfaces of the CA contact 120. The materials that are most effective in providing the above-described barrier, adhesion and reliability functions are also relatively high resistivity materials that can slow down current flow through the interconnect structure stack 102C in the vertical direction. In accordance with aspects of the invention, current flowing in the vertical direction from the TS contact 110 to the CA contact 120 only needs to pass through the dual-role liner 124, which reduces the vertical current resistance for the interconnect stack 102C in comparison to known interconnect stack architectures which would require current flowing from the TS contact 110 to the CA contact 120 to flow through a TS cap and a separate CA liner.

Continuing with FIG. 4, the M0 line 130 is formed in a second region 106A of the second dielectric layer formed by 106A and 106B. The second dielectric region 106B is formed over the first dielectric region 106A, and a cap layer 126A is formed on a top surface of the M0 line 130. The second liner region 122B is on sidewalls of the M0 line 130, and, in accordance with aspects of the invention, the M0 line 130 is configured to be substantially integral with the CA contact 120. Accordingly, in the interconnect stack 102C, no dual-role liner is needed between the CA contact 120 and the M0 line 130. The M0 line 130 configured to be substantially integral with the CA contact 120 is in contrast to known interconnect stack architectures in which a CA cap would be provided for CA contact 120, and a separate M0 liner for the separate M0 line 130 would be positioned on top of the CA cap. Accordingly, current flowing in the vertical direction from the CA contact 120 to the M0 line 130 would not need to pass through any low resistivity liner or cap layers, which reduces the vertical current resistance in comparison to known interconnect stack architectures which would require current flowing from the CA contact 120 to the M0 line 130 to flow through both a CA cap and an M0 liner.

In embodiments of the invention, the first dielectric layer 104 and the first and second regions 106A, 106B of the second dielectric layer can be the same or different material. In some embodiments of the invention, the first dielectric region 104 can be formed from a variety of dielectric materials, including, but not limited to, SiO$_2$. In some embodiments of the invention, the first and second regions 106A, 106B of the second dielectric layer can be formed from a variety of dielectric materials, including, but not limited to, SiBCN, SiOCN, and SiN. The liners 112, 122A, 122B, the cap layers 114A, 126A, and the dual-role liner 124 can be the same or different material. In some embodiments of the invention, the liner 112 can be formed from a variety of high resistivity materials, including, but not limited to, TiN. In some embodiments of the invention, the liner 122A can be formed from a variety of high resistivity materials, including, but not limited to, TiN. In some embodiments of the invention, the liner 122B can be formed from a variety of high resistivity materials, including, but not limited to, TiN, Co, Ru, and TaN. In some embodiments of the invention, the cap layer 114A can be formed from a variety of high resistivity materials, including, but not limited to, TiN. In some embodiments of the invention, the cap layer 126A can be formed from a variety of high resistivity materials, including, but not limited to, TiN, Co, Ru, and TaN. In some embodiments of the invention, the dual-role liner 124 can be formed from a variety of high resistivity materials, including, but not limited to, TiN. In embodiments of the invention, the TS contact 110, the CA contact 120, and the M0 line can be the same or different material. In some embodiments of the invention, the TS contact 110 can be formed from a variety of low resistivity silicide materials, including, but not limited to, tungsten (W). In some embodiments of the invention, the CA contact 120 can be formed from a variety of low resistivity materials, including, but not limited to Cu. In some embodiments of the invention, the M0 line 130 can be formed from a variety of low resistivity materials, including, but not limited to Cu.

Figure 5:
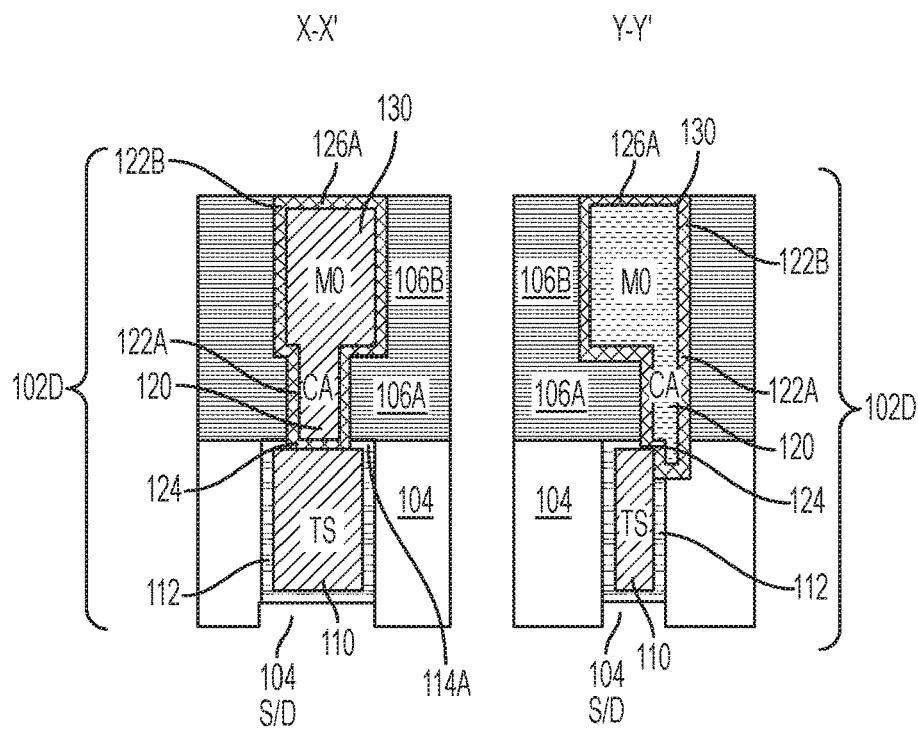
FIG. 5 depicts cross-sectional views an of example of the interconnect stack shown in FIG. 1, taken along lines x-x' and y-y', wherein a portion of the interconnect structure is misaligned.

FIG. 5 depicts cross-sectional views of an interconnect stack 102D in accordance with aspects of the invention. The interconnect stack 102D is identical to the interconnect stack 102C shown in FIG. 4 except the CA contact 120 in the interconnect stack 102D was misaligned during fabrication. CA contact misalignment is a known problem semiconductor wafer fabrication. As best shown in the y-y' view of FIG. 5, as a result of a CA contact misalignment, the region of overlap between the CA contact 120 and the TS contact 110 has been reduced in comparison to the non-misaligned interconnect stack 102C. A technical benefit and effect of aspects of the invention is that the reduced vertical resistance that results from the dual-role liner 124 and the substantially integral M0 line 130 and CA contact 120 at least mitigates, and in some instances offset, the impact of the misalignment shown in FIG. 5.

Figure 6:
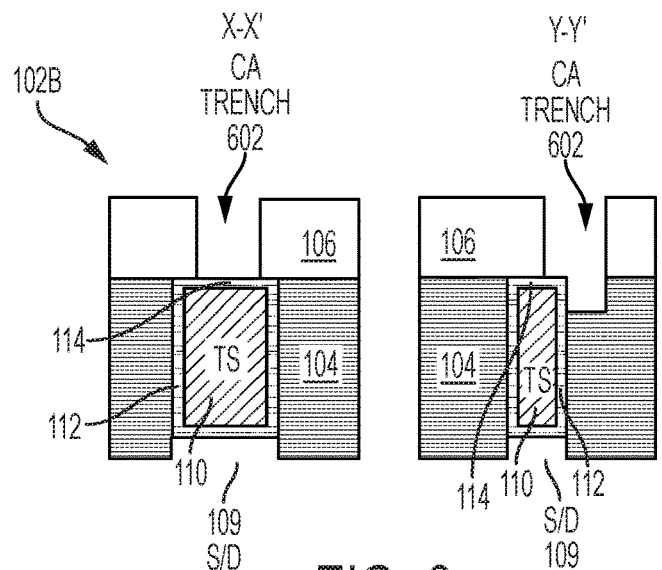

FIGS. 6-11 depicts cross-sectional views of a semiconductor wafer after fabrication operations for forming the interconnect structure stacks 102A, 102B shown in FIGS. 2 and 3 according to embodiments of the invention. More specifically, FIG. 6 depicts a cross-sectional view of the interconnect structure stack 102B after known fabrication operations have been used to form the interconnect stack 102B at the fabrication stage depicted in FIG. 6. In aspects of the invention, the known fabrication operations include depositing an ILD insulating material (e.g., SiO2) over a transistor (represented by the S/D region 109) of a wafer to form the first dielectric layer 104. A TS trench (not shown) is formed in the first dielectric layer 104 using, for example, a reactive ion etch (RIE) process. The TS is positioned over the portion of the transistor (e.g., S/D region 109) to which electrical coupling will be made. The liner 112 is deposited in the TS trench using any deposition technique suitable for the material that has been selected to form the liner 112. The remaining volume of the TS trench is filled with the material from which the TS contact 110 is formed using, for example, a chemical/electroplating process. The excess material used to form the TS contact 110 is removed and planarized to form a flat surface for subsequent processing. A cap layer 114 is deposited over the exposed top surface of the TS contact 110. A second dielectric layer 106 is deposited over the first dielectric layer 104, and a CA trench 602 is formed in the second dielectric layer 106 (e.g., using a RIE). Due to an alignment error, the CA trench 602 is misaligned with respect to the TS contact 110, which is best shown in the y-y' view of FIG. 6.

Figure 7:
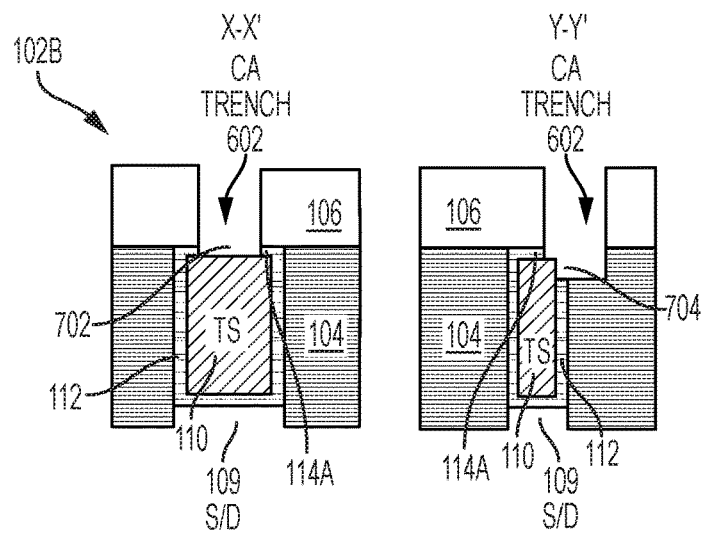

In FIG. 7, known fabrication operations have been used to remove a portion of the cap layer 114 that was exposed by the CA trench 602, thereby forming a partial cap layer 114A and exposing a top surface (best shown in the x-x' view) and a sidewall surface (best shown in the y-y' view) of the TS contact 110. In some embodiments of the invention, the need to remove an exposed portion of the cap layer 114 can be avoided by not depositing the cap layer 114 in areas of the top surface of the TS contact 110 that will be under the CA trench 602.

Figure 8:
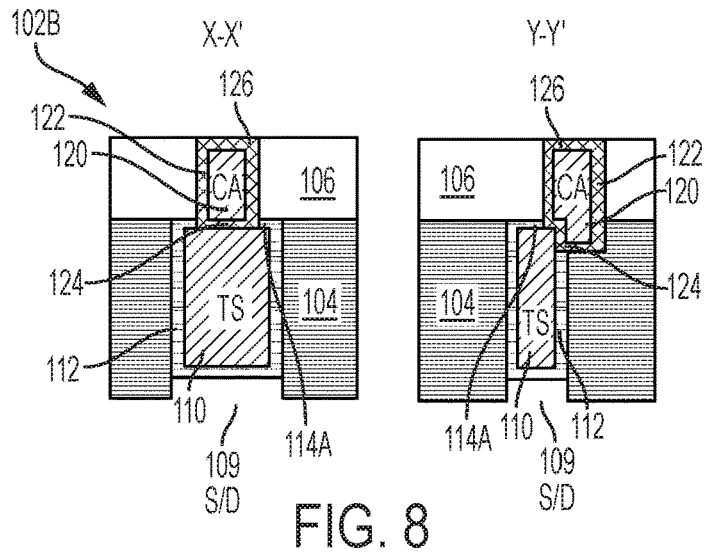

In FIG. 8, known fabrication operations have been used to deposit the liner 122 and the dual-role liner 124 in the CA trench 602 (shown in FIG. 7) using any deposition technique suitable for the material that has been selected to form the liner 122 and the dual-role liner 124. The remaining volume of the CA trench 602 (shown in FIG. 7) is filled with the material from which the CA contact 120 is formed using, for example, a chemical/electroplating process. The excess material used to form the CA contact 120 is removed and planarized to form a flat surface for subsequent processing. A cap layer 126 is deposited over the exposed top surface of the CA contact 120. Although the fabrication operations illustrated in FIGS. 6-8 depict the misaligned interconnect structure stack 102B shown in FIG. 3, the same fabrication operations are used to form the non-misaligned interconnect structure stack 102A shown in FIG. 2.

Figure 9:
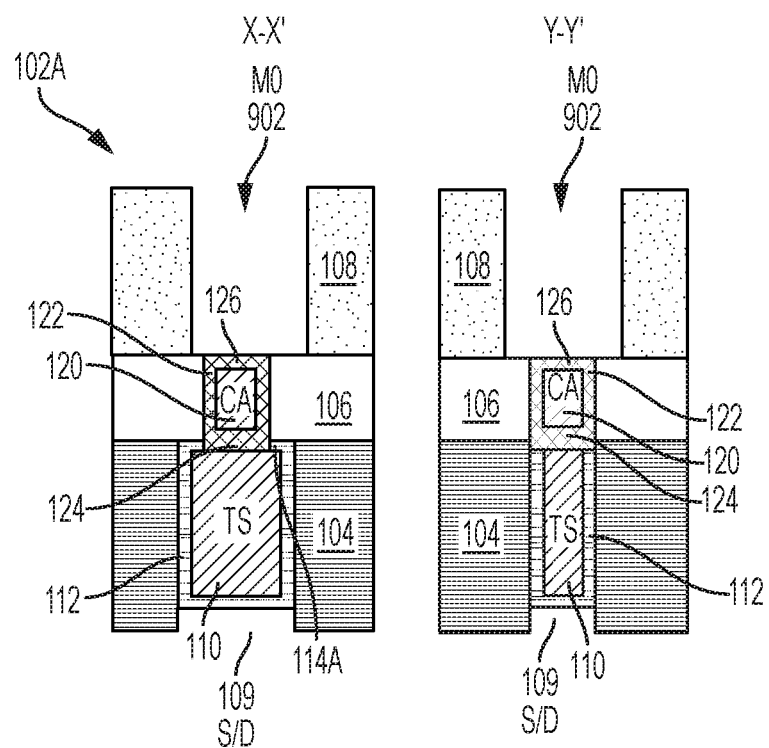
Figure 10:
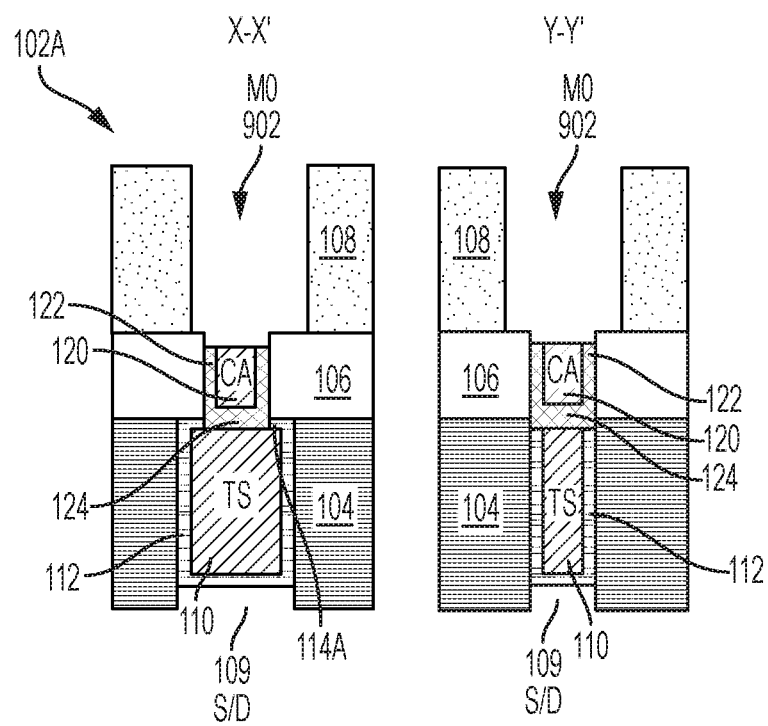
Figure 11:
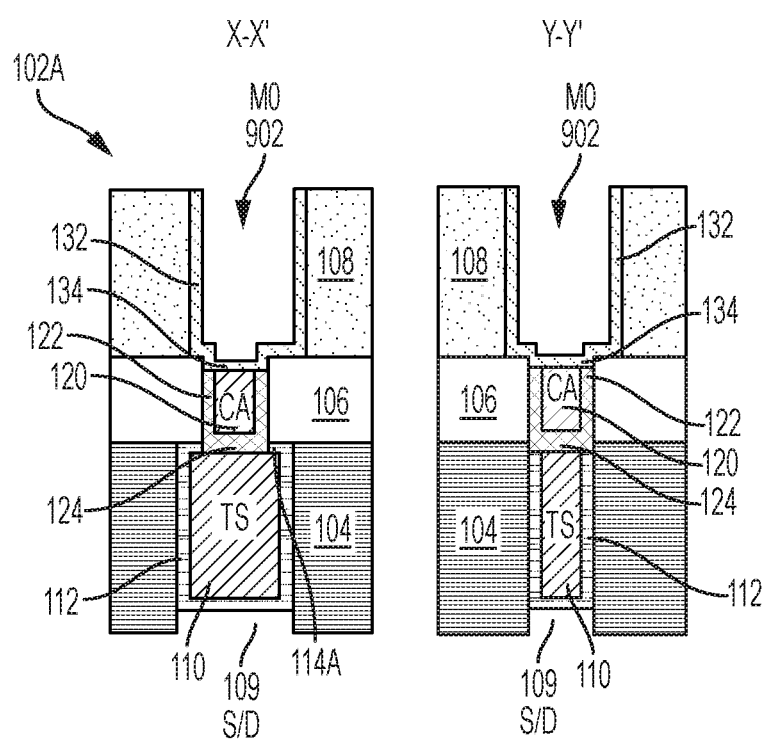

FIGS. 9-11 depict the next sequence of fabrication operations as applied to the non-misaligned interconnect structure stack 102A (shown in FIG. 2). The fabrication operations shown in FIGS. 9-11 apply equally to the misaligned interconnect structure stack 102B (shown in FIG. 3).

In FIG. 9, known fabrication operations have been used to deposit a third dielectric layer 108 over the second dielectric layer 106, and an M0 trench 902 is formed in the third dielectric layer 108 (e.g., using a RIE).

In FIG. 10, known fabrication operations have been used to remove the cap layer 126, which was exposed by the M0 trench 902, thereby exposing a top surface of the CA contact 120. In some embodiments of the invention, the need to remove the cap layer 126 can be avoided by not depositing the cap layer 126 in areas of the top surface of the CA contact 120 that will be under the M0 trench 902.

In FIG. 11, known fabrication operations have been used to deposit the liner 132 and the dual-role liner 134 in the M0 trench 902 (shown in FIG. 10) using any deposition technique suitable for the material that has been selected to form the liner 132 and the dual-role liner 134. The remaining volume of the M0 trench 902 is filled with the material from which the M0 line 130 (shown in FIG. 2) is formed using, for example, a chemical/electroplating process. The excess material used to form the M0 line 120 is removed and planarized to form a flat surface for subsequent processing.

As shown by the final interconnect structure stack 102A shown in FIG. 2, the cap layer 136 is deposited over the exposed top surface of the M0 line 130.

Substantially the same fabrication operations depicted in FIGS. 6-11 can be used to fabricate the non-misaligned interconnect structure stack 102C shown in FIG. 3, as well as the misaligned interconnect structure stack 102D shown in FIG. 4. The necessary modifications to the fabrication operations depicted in FIGS. 6-11, in light of the teachings in this detailed description, would be understood by a person skilled in the relevant arts. For example, the first and second dielectric regions 106A, 106B are formed instead of the second and third dielectric layers 106, 108. Additionally, there is no need, when forming the interconnect structure stacks 102C, 102D to form the dual-role liner 126. Other modifications will be readily apparent to and within the capabilities of a person skilled in the relevant arts.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an interconnect stack, the method comprising:
   forming a first dielectric layer;
   forming a first trench in the first dielectric layer;
   depositing a first liner in the first trench, wherein the first liner defines a second trench;
   depositing a first conductive material in the second trench;
   depositing a second dielectric layer over the first dielectric layer and the first conductive material, wherein the second dielectric layer comprises a first region and a second region;
   forming a third trench extending through the second dielectric layer and over the first conductive material;
   wherein a first region of the third trench is within the first region of the second dielectric layer;
   wherein a second region of the third trench is within the second region of the second dielectric layer;
   exposing at least a portion of a top surface of the first conductive material, wherein a bottom surface of the third trench comprises the exposed portion of the top surface of the first conductive material; and
   depositing a second liner in the first region and the second region of the third trench;
   wherein the second liner is on sidewalls of the third trench;
   wherein the second liner that is in the first region of the third trench is a different material than the second liner that is in the second region of the third trench;
   wherein the second liner is also on the exposed portion of the top surface of the first conductive material; and
   wherein the second liner that is on the exposed portion of the top surface of the first conductive material functions as a cap region configured to counter electro-migration or surface migration at the top surface of the first conductive material.

2. The method of claim 1 further comprising depositing a cap layer over a top surface of the first conductive material, wherein exposing the portion of the top surface of the first conductive material comprises removing at least a portion of the cap layer.

3. The method of claim 1, wherein:
the second liner defines a fourth trench;
the method further comprises depositing a second conductive material in the fourth trench; and
the second liner adheres a portion of the second conductive material to the second dielectric layer.

4. The method of claim 3 further comprising depositing a third dielectric layer over the second dielectric layer and the second conductive material.

5. The method of claim 4 further comprising forming a fifth trench extending through the third dielectric layer and over the second conductive material.

6. The method of claim 5 further comprising exposing at least a portion of the top surface of the second conductive material, wherein a bottom surface of the fifth trench comprises the exposed portion of the top surface of the second conductive material.

7. The method of claim 6 further comprising depositing a cap layer over a top surface of the second conductive material, wherein exposing the portion of the top surface of the second conductive material comprises removing at least a portion of the cap layer.

8. The method of claim 6 further comprising:
depositing a third liner in the fifth trench;
wherein the third liner is on sidewalls of the fifth trench;
wherein the third liner is also on the exposed portion of the top surface of the second conductive material; and
wherein the third liner that is on the exposed portion of the top surface of the second conductive material functions as a cap region configured to counter electro-migration or surface migration at the top surface of the second conductive material.

9. The method of claim 8, wherein the third liner defines a sixth trench.

10. The method of claim 9 further comprising:
depositing a third conductive material in the sixth trench; and
depositing a cap layer over an exposed surface of the third conductive material;
wherein a bottom region of the first liner is communicatively coupled to a source region of a transistor or a drain region of the transistor.

11. A method of forming an interconnect stack, the method comprising:
forming a first dielectric layer;
forming a first trench in the first dielectric layer;
depositing a first liner in the first trench, wherein the first liner defines a second trench;
depositing a first conductive material in the second trench;
depositing a second dielectric layer over the first dielectric layer and the first conductive material, wherein the second dielectric layer comprises a first region and a second region;

forming a third trench extending through the first and second regions of the second dielectric layer and over the first conductive material;
wherein a first region of the third trench is within the first region of the second dielectric layer;
wherein a second region of the third trench is within the second region of the second dielectric layer;
wherein a volume of the first region of the third trench is different than a volume of the second region of the third trench;
exposing at least a portion of the top surface of the first conductive material, wherein a bottom surface of the third trench comprises the exposed portion of the top surface of the first conductive material; and
depositing a second liner in the first region and the second region of the third trench;
wherein the second liner that is in the first region of the third trench is a different material than the second liner that is in the second region of the third trench;
wherein the second liner is on sidewalls of a first portion of the third trench;
wherein the second liner is also on sidewalls of a second portion of the third trench;
wherein the second liner is also on the exposed portion of the top surface of the first conductive material; and
wherein the second liner that is on the exposed portion of the top surface of the first conductive material functions as a cap region configured to counter electro-migration or surface migration at the top surface of the first conductive material.

12. The method of claim 11 further comprising depositing a cap layer over a top surface of the first conductive material, wherein exposing at least the portion of the top surface of the first conductive material comprises removing a portion of the cap layer.

13. The method of claim 11 further comprising depositing a second conductive material in the first region of the third trench, wherein the second liner adheres a portion of the second conductive material to the first region of the second dielectric layer.

14. The method of claim 13, wherein a bottom surface of the second region of the third trench comprises a top surface of the second conductive material.

15. The method of claim 14 further comprising:
depositing a third conductive material in the second region of the third trench; and
depositing a cap layer over an exposed surface of the third conductive material;
wherein a bottom region of the first liner is communicatively coupled to a source region of a transistor or a drain region of the transistor.

16. The method of claim 15, wherein
the second conductive material is the same material as the third conductive material.

17. The method of claim 15, wherein
the second conductive material is a different material than the third conductive material.

* * * * *